United States Patent [19]

Asari

[11] Patent Number: 5,093,586

[45] Date of Patent: Mar. 3, 1992

[54] VOLTAGE STEP-UP CIRCUIT FOR NON-VOLATILE SEMICONDUCTOR MEMORY

[75] Inventor: Seiichirou Asari, Itami, Japan

[73] Assignee: Mitsubishi Denki Kabushiki Kaisha, Tokyo, Japan

[21] Appl. No.: 514,782

[22] Filed: Apr. 25, 1990

[30] Foreign Application Priority Data

Aug. 28, 1989 [JP] Japan .................. 1-220886

[51] Int. Cl.[5] .................. H03K 3/01; H03K 19/094
[52] U.S. Cl. .................. 307/296.1; 363/60; 307/451; 365/189.11; 365/226
[58] Field of Search .................. 307/578, 296.1, 451; 363/60; 365/226, 189.09, 189.11

[56] References Cited

U.S. PATENT DOCUMENTS

| | | | |
|---|---|---|---|
| 4,061,929 | 12/1977 | Asano | 307/296.1 |
| 4,254,345 | 3/1981 | Ullrich | 307/578 |
| 4,295,062 | 10/1981 | Mihalich et al. | 307/279 |
| 4,311,923 | 1/1982 | Luscher et al. | 307/578 |
| 4,563,594 | 1/1986 | Koyama | 307/451 |
| 4,654,548 | 3/1987 | Tanizawa et al. | 307/451 |
| 4,806,802 | 2/1989 | Okitaka et al. | 307/451 |

OTHER PUBLICATIONS

"On-chip High Voltage Generation in MNOS Integrated Circuits . . . ", IEEE Journal of Solid State Circuits, vol. SC-11, No. 3, '76.

"Erasable 64KB EEPROM Capable of Building a Program Power Therein", Electronic Communication Soc. Papers, vol. J66-C, No. 12, 12/83.

"5V Single-Power-Operated EAROM", Natl. Technical Report, vol. 32, No. 1, 2/86, Natl. Electric Co., Ltd.

Primary Examiner—Stanley D. Miller
Assistant Examiner—Richard Roseen
Attorney, Agent, or Firm—Townsend and Townsend

[57] ABSTRACT

A voltage step-up circuit for a non-volatile semiconductor memory which includes a first series of an odd number of inverters (20), a second series of an even number of inverters (21), and a transmission gate (203) provided in the pre-stage inverter of each inverter series to control the potentials inputted to the p-channel and n-channel transistors of the final-stage inverter so that both the transistors are not simultaneously turned on.

7 Claims, 5 Drawing Sheets

VOLTAGE STEP-UP CIRCUIT FOR NON-VOLATILE SEMICONDUCTOR MEMORY

BACKGROUND OF THE INVENTION

The present invention relates to a voltage step-up circuit for generating a high voltage which is used to change the threshold voltage of an electrically erasable, non-volatile semiconductor memory.

The electrically erasable, non-volatile memories include an electrically erasable programmable read only memory (EEPROM) and an electrically alterable read only memory (EAROM). To alter the contents of an EEPROM, for example, it is necessary to apply a high voltage to the memory cells of the EEPROM to change the threshold voltage of the memory cells. The high voltage usually ranges from 15 to 20 volts. To generate this high voltage, a voltage step-up circuit is used. One example of the voltage step-up circuit for a non-volatile memory is shown in FIGS. 3-8.

In FIG. 3, a voltage step-up circuit 3 is connected to an EEPROM 1 via a decoder 2 which designates a series of addresses in the EEPROM 1. The EEPROM 1 is composed of a number of memory cells 1a, one of which is shown in FIG. 8. The memory cell is consists of a pair of source drains 18 formed on a substrate 17, a floating gate 16, and a control gate 15.

The voltage step-up circuit 3 includes an oscillator 10 for generating a high speed clock signal, a first series 20 of three inverters 20a, 20b, 20c for inverting the clock signal, a second series 21 of two inverters 20b, 20c, and a series 30 of MOS transistors 30a in cascade connection, the gates of which are alternatingly connected to the first and second inverter series 20 and 21 via a capacitor 40. As shown in FIG. 5, each of the inverters 20a, 20b, 20c is composed of a p-channel transistor 200 which is connected to a high-potential power line and turned on upon reception of a clock pulse g, and an n-channel transistor 201 which is connected to a low-potential power line.

In operation, the phase of a clock signal g from the oscillator 10 is inverted by the first and second inverter series 20 and 21. The phase-inverted, high-speed clock signal is inputted to the transistor series 30 to alternatingly turn on the transistors 30a. Consequently, the voltage applied to the gate of a transistor 30a is increased by the transistor 30a on the preceding stage. As shown in FIG. 4, the voltage applied to the drain of a transistor 30a is stepped up according to the bootstrap principle. To accomplish this, a high-speed clock pulse signal of a few MHz is required. The high voltage from the step-up circuit 3 is applied to a designated address series of the EEPROM 1 via the decoder 2 for writing new data.

As shown in FIG. 6, in the period ($t_1$-$t_2$) when the output e of the inverter 20b, which is rising from a low level to a high level in response to a clock pulse g, is lower than the threshold voltage $V_{TH}$ of an n-channel transistor, only the p-channel transistor 200c is on so that the output f is at a high level. In the period ($t_2$-$t_3$) when the output e is higher than the threshold voltage $V_{TH}$ of an n-channel transistor but lower than the threshold voltage $V_{TH}$ of a p-channel transistor, both the p-channel and n-channel transistors 200c and 201c are on so that the output f is at a fraction of the line voltage which is proportional to the On-time resistance of the n-channel transistor over the On-time resistance of the p-channel and n-channel transistors. In the period ($t_3$-$t_4$) when the output e is higher than the threshold voltage $V_{TH}$ of a p-channel transistor, the p-channel transistor 200c is off so that the output f is at a low level.

When the output e is drops from the high level to the low level, the events take place in the order opposite to those described above.

In the above inverter, a large amount of through current flows in the period when both the p-channel and n-channel transistors 200c and 201c are on. In order to prevent this through current, Japanese Patent Application Kokai No. 63-38250 has proposed, as shown in FIG. 7, that a resister 202 is connected between the drains of p-channel and n-channel transistors 200b and 201b of a preceding inverter 20b, and that the gates of p-channel and n-channel transistors 200c and 201c of the subsequent inverter 20c are connected across the resister 202, thereby shortening the period when both the p-channel and n-channel transistors 200c and 201c are on, thus minimizing the through current.

A burst of through current in the inverters 20a-20c of the step-up circuit 3 produces electromagnetic waves, which are absorbed by the memory cells to produce electron-hole pairs or free carriers in a space between the floating gate and the substrate and other areas where carriers are exchanged. Consequently, at the time of writing when a large amount of through current flows, the change of a threshold value, which is determined by the tunnel effect, can be disturbed. The smaller the cell area per memory transistor or the larger the memory capacity, the larger this effect. In addition, the through current produces noise.

SUMMARY OF THE INVENTION

Accordingly, it is an object of the invention to provide a compact voltage step-up circuit for a non-volatile semiconductor memory which produces little noise at the time of rewriting.

According to the invention, the above object is achieved by a voltage step-up circuit for a non-volatile semiconductor memory, which includes an oscillator for generating a high-speed clock signal; a first series of an odd number of inverters connected to the oscillator for inverting the clock signal; a second series of an even number of inverters connected to the oscillator for inverting the clock signal; a series of transistors in cascade connection, the gate of which are connected to the first and second inverter series so that the transistors are alternately turned on by outputs from the respective inverters; each of the inverters consisting of p-channel and n-channel transistors which are turned on in succession when a clock pulse is inputted to the gates; and a transmission gate connected between drains of said p-channel and n-channel transistors of a pre-stage inverter and at opposite ends to gates of the p-channel and n-channel transistors of a final-stage inverter.

The above and other objects, features, and advantages of the invention will become more apparent from the following description when taken in conjunction with the accompanying drawings.

DESCRIPTION OF THE PREFERRED EMBODIMENT

Figure 1:
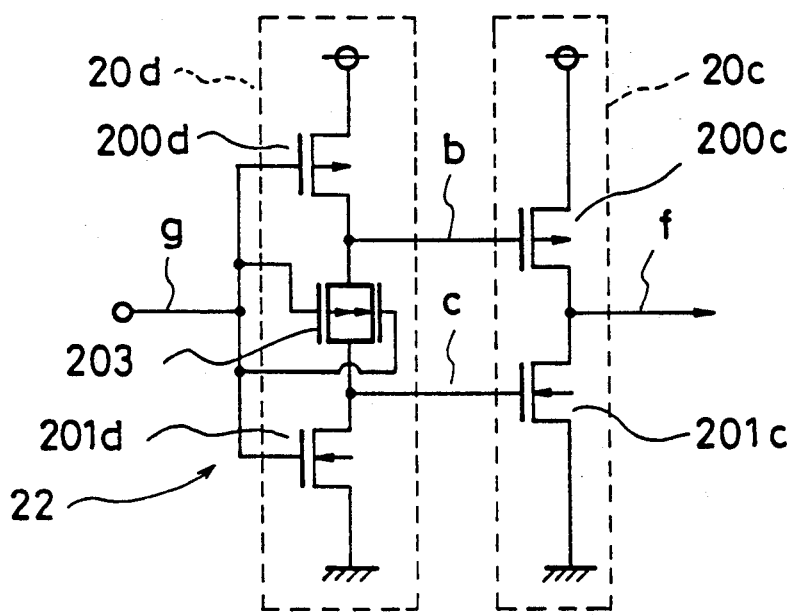
FIG. 1 is a circuit diagram of an inverter series for use in a voltage step-up circuit for a non-volatile semiconductor memory according to an embodiment of the invention.

In FIG. 1, like reference numerals denote like or corresponding parts of FIGS. 3-9. The inverter series 22 of a voltage step-up circuit 3 includes a pre-stage inverter 20d, and a final-stage inverter 20c. The pre-stage inverter 20d includes a transmission gate 203 connected between the drains of p-channel and n-channel transistors 200d and 201d. Opposite ends of the transmission gate 203 are connected to the gates of p-channel and n-channel transistors 200c and 201c, respectively.

Figure 2:
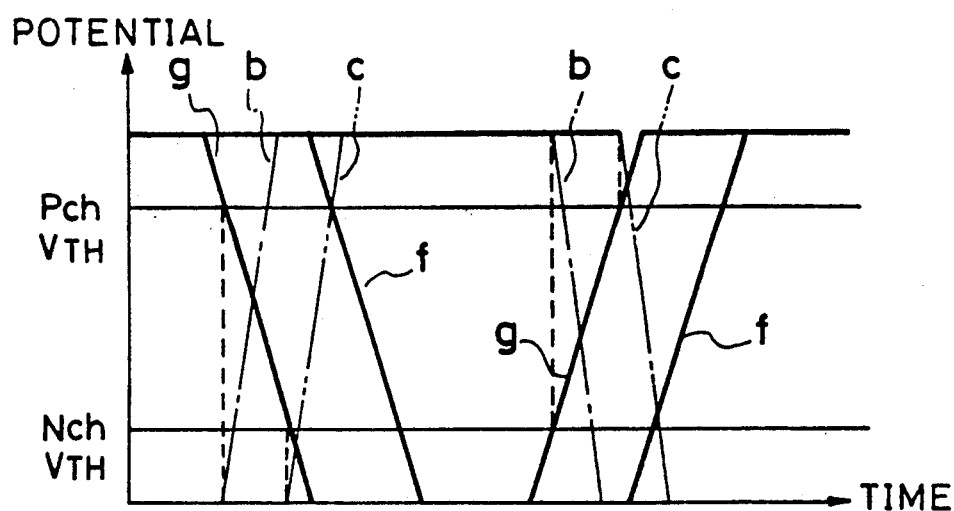
FIG. 2 is a potential diagram useful for explaining how the inverter of FIG. 1 works.
Figure 3:
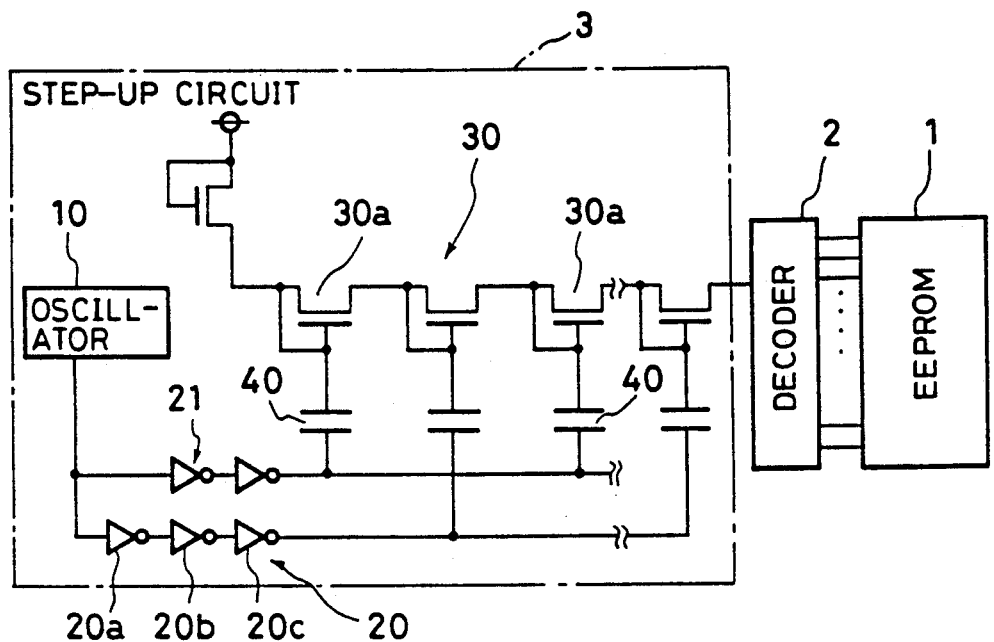
FIG. 3 is a block diagram of a conventional voltage step-up circuit for a non-volatile semiconductor memory.
Figure 4:
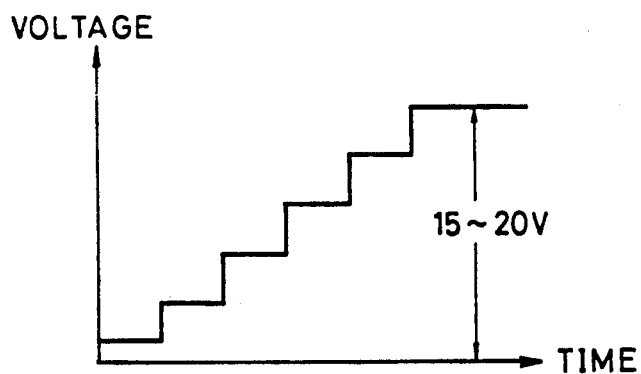
FIG. 4 is a voltage diagram useful for explaining how the voltage step-up circuit of FIG. 3 works.
Figure 5:
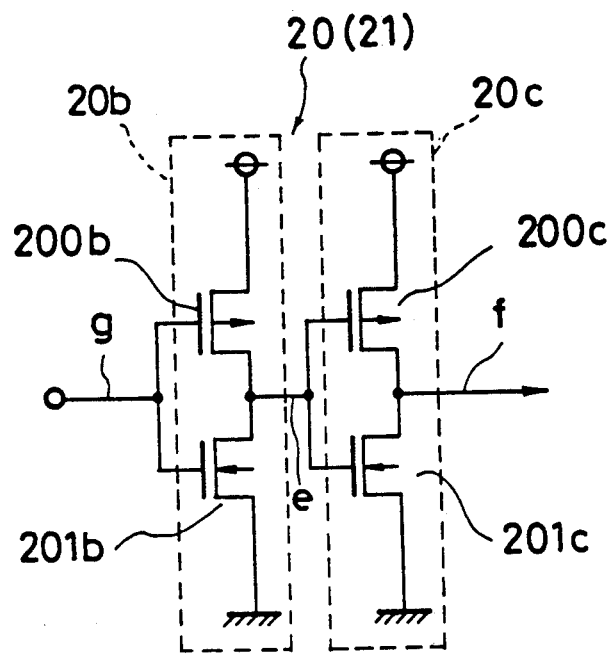
FIG. 5 is a circuit diagram of a conventional inverter series for use in a voltage step-up circuit.
Figure 6:
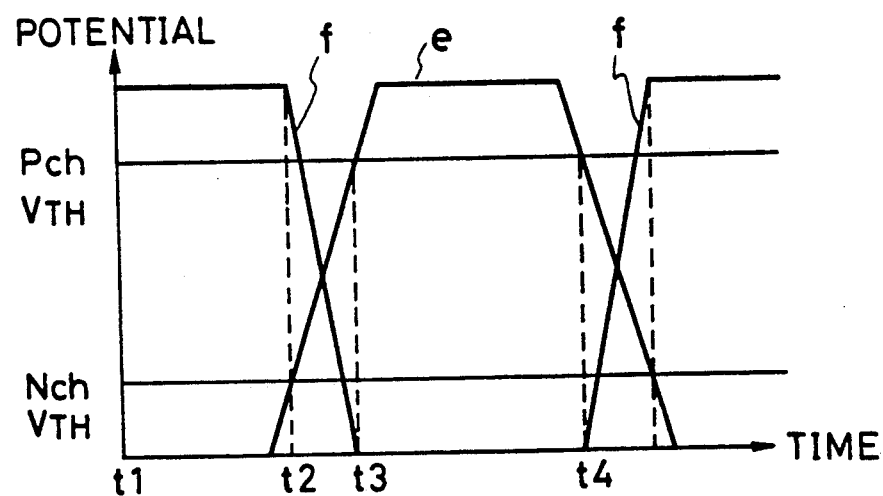
FIG. 6 is a potential diagram useful for explaining how the inverter series of FIG. 5 works.
Figure 7:
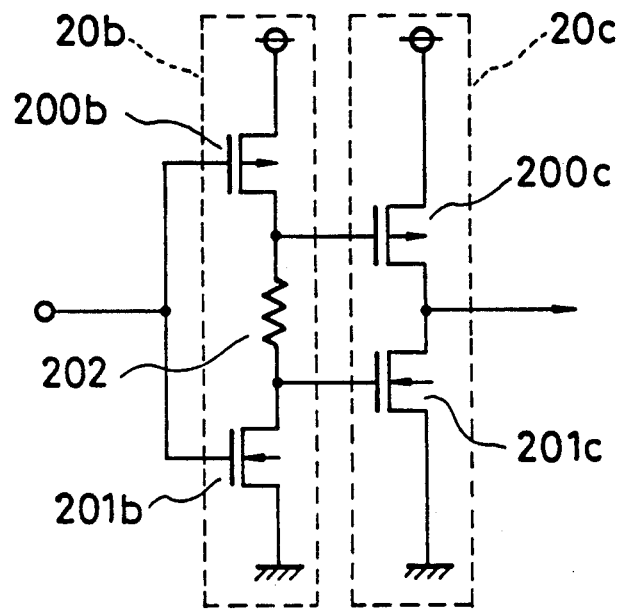
FIG. 7 is a circuit diagram of another conventional inverter series for use in a voltage step-up circuit.
Figure 8:
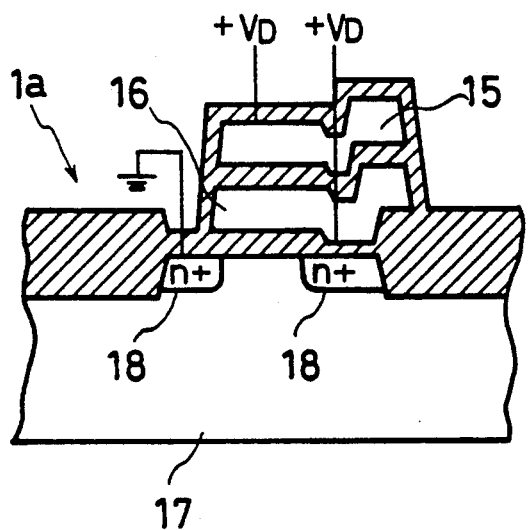
FIG. 8 is a sectional view of a conventional memory cell.

The operation is described with respect to FIG. 2. When the potential of a clock pulse g outputted from the oscillator 10 drops below the threshold voltage $V_{TH}$ of a p-channel transistor, the pre-stage p-channel transistor 200d is turned on. Since the transmission gate 203 is off, the potential b to the final-stage p-channel transistor 200c rises to turn it off, while the potential c to the final-stage n-channel transistor 201c remains at a low level until the potential of a clock pulse g reaches such a level that the transmission gate 203 is turned on or the n-channel transistor 201d is turned off.

When the potential of a clock pulse g falls below the threshold voltage $V_{TH}$ of an n-channel transistor, the n-channel transistor 201d is turned off while the transmission gate 203 is turned on so that the potential c rises. Consequently, the final-stage n-channel transistor 201c is turned on, making the output f low. At this point, the final-stage p-channel transistor 200c is off, thus preventing any through current.

Similarly, when the potential of a clock pulse g changes from a low level to a high level, the potentials b and c change as shown in FIG. 2 so that no through current flows. The transmission gate 203 formed on the chip is smaller than the resistor 202 of FIG. 7.

Figure 9:
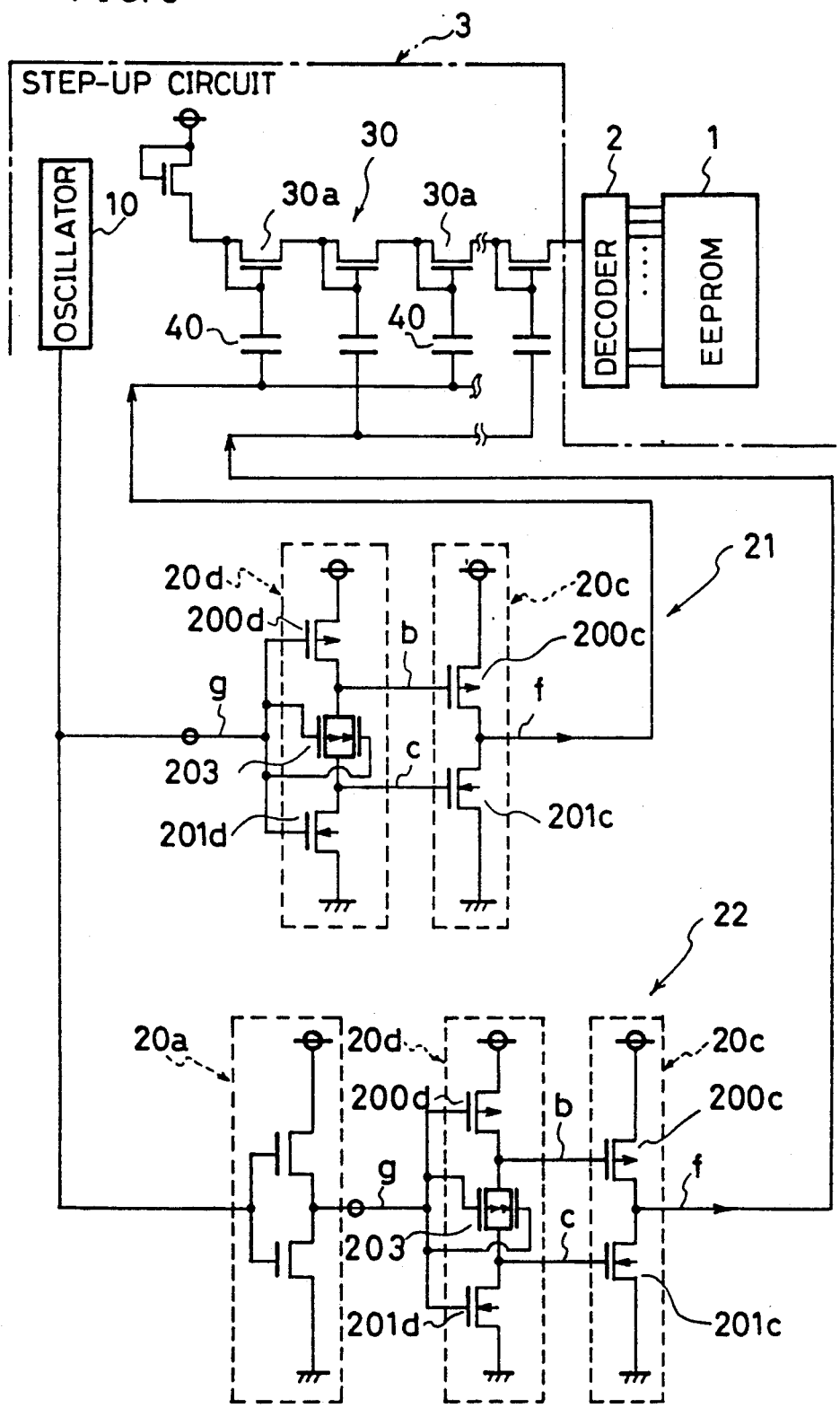
FIG. 9 is a circuit diagram of a voltage step-up circuit for a non-volatile semiconductor memory according to an embodiment of the present invention.

As has been described above, even if the clock pulse reaches such a potential that turns on both the final-stage p-channel and n-channel transistors at the same time, the transmission gate on the preceding stage turns on the respective transistors in succession so that any through current in the inverter is suppressed, thus preventing noise which otherwise can be produced at the time of rewriting. In addition, the transmission gate formed on the chip is smaller than the replaced resistor so that it is possible to make the entire circuit smaller. FIG. 9 is a circuit diagram of a voltage step-up circuit according to an embodiment of the present invention and incorporating the features and advantages described above.

I claim:

1. A voltage step-up circuit for a non-volatile semiconductor memory, comprising:
   an oscillator for generating a high-speed clock signal;
   a first series of an odd number of inverters connected to said oscillator for inverting said clock signal;
   a second series of an even number of inverters connected to said oscillator for inverting said clock signal;
   a series of transistors in cascade connection, which are alternatively turned on by outputs from a respective inverter of said first and second series of inverters wherein;
   a pre-stage inverter in a final stage of said first series of inverters and second series of inverters connecting a drain of a p-channel transistor to a drain of an n-channel transistor through a transmission gate having two sides, wherein said two sides of said transmission gate are connected to gates of a second p-channel transistor and a second n-channel transistor of the inverters in the final stage respectively;
   said pre-stage inverters of said first and second series of inverters connect, at a given node, the gates of said p-channel and n-channel transistors to the gates of both sides of said transmission gate;
   said second series of inverters including at least one first stage inverter turned on in succession when a clock pulse of said clock signal is input to gates of said p-channel and n-channel transistors; and
   said clock pulse is output to said given node of said second series of inverters through said at least one first stage inverter.

2. The voltage step-up circuit of claim 1, wherein said transmission gate is made of a MOS transistor.

3. The voltage step-up circuit of claim 1, wherein said transmission gate is made such that an On voltage is lower than an Off voltage of said final-stage p-channel transistor.

4. A voltage step-up circuit for a non-volatile semiconductor memory comprising:
   a plurality of transistors connected in series and wherein a first one of said plurality of transistors is coupled to said non-volatile semiconductor memory;
   an oscillator;
   a first series of inverters having an even number of inverters therein and including:
   (i) a first and a second MOS transistor of a first conductivity type, wherein a gate of said first MOS transistor and a gate of said second MOS transistor are coupled to said oscillator and wherein a drain of said first MOS transistor is coupled to a source of said second MOS transistor, and wherein a source of said first MOS transistor is coupled to a first reference voltage;
   (ii) a third MOS transistor of a second conductivity type having a gate coupled to said oscillator, a drain coupled to a second reference voltage and a source coupled to a drain of said second MOS transistor;
   (iii) a fourth MOS transistor of said second conductivity type having a gate coupled to said oscillator, a source coupled to a source of said second MOS transistor, and a drain coupled to said drain of said second MOS transistor;
   (iv) a fifth MOS transistor of said second conductivity type having a drain coupled to said second reference voltage, a gate coupled to said drain of said second MOS transistor, and a source coupled to first node;
(v) a sixth MOS transistor of said first conductivity type having a drain coupled to said first node, a gate coupled to said source of said second MOS transistor, and a source coupled to said first reference voltage; and
(vi) wherein said first node is coupled to a first subset of said plurality of transistors;

a second series of inverters having an odd number of inverters therein and including:
(i) a seventh and an eighth MOS transistor of a first conductivity type, wherein a gate of said seventh MOS transistor and a gate of said eighth MOS transistor are coupled to a second node and wherein a drain of said seventh MOS transistor is coupled to a source of said eighth MOS transistor, and wherein a source of said seventh MOS transistor is coupled to a first reference voltage;
(ii) a ninth MOS transistor of said second conductivity type having a gate coupled to said second node, a drain coupled to said second reference voltage and a source coupled to a drain of said eighth MOS transistor;
(iii) a tenth MOS transistor of said second conductivity type having a gate coupled to said second node, a source coupled to a source of said eighth MOS transistor, and a drain coupled to said drain of said eighth MOS transistor;
(iv) an eleventh MOS transistor of said first conductivity type having a source coupled to said first reference voltage, a gate coupled to said drain of said seventh MOS transistor, and a drain coupled to a third node;
(v) a twelfth MOS transistor of said second conductivity type having a source coupled to said third node, a gate coupled to said drain of said eighth MOS transistor, and a drain coupled to said second reference voltage;
(vi) wherein said third node is coupled to a second subset of said plurality of transistors;
(vii) a thirteenth MOS transistor having a source coupled to said first reference voltage, a gate coupled to said oscillator and a drain coupled to said second node; and
(viii) a fourteenth MOS transistor having a source coupled to said second node, a gate coupled to said oscillator, and a drain coupled to said first reference voltage.

5. The voltage step-up circuit of claim 4 wherein said MOS transistor of said first conductivity type is a P MOS transistor.

6. The voltage step-up circuit of claim 4 wherein said MOS transistor of said second conductivity type is an N MOS transistor.

7. The voltage step-up circuit of claim 4 further comprising:
a first set of capacitors disposed between said first node and said first subset of said plurality of transistors; and
a second set of capacitors disposed between said third node and said second subset of said plurality of transistors.

* * * * *